(12) United States Patent
Lanzillo et al.

(10) Patent No.: US 11,854,884 B2
(45) Date of Patent: Dec. 26, 2023

(54) FULLY ALIGNED TOP VIAS

(71) Applicant: INTERNATIONAL BUSINESS MACHINES CORPORATION, Armonk, NY (US)

(72) Inventors: Nicholas Anthony Lanzillo, Wynantskill, NY (US); Koichi Motoyama, Clifton Park, NY (US); Somnath Ghosh, Clifton Park, NY (US); Christopher J. Penny, Saratoga Springs, NY (US); Robert Robison, Rexford, NY (US); Lawrence A. Clevenger, Saratoga Springs, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 84 days.

(21) Appl. No.: 17/551,531

(22) Filed: Dec. 15, 2021

(65) Prior Publication Data

US 2022/0108922 A1 Apr. 7, 2022

Related U.S. Application Data

(62) Division of application No. 16/678,053, filed on Nov. 8, 2019, now Pat. No. 11,217,481.

(51) Int. Cl.
*H01L 23/532* (2006.01)
*H01L 21/768* (2006.01)
*H01L 23/522* (2006.01)

(52) U.S. Cl.
CPC .. *H01L 21/76897* (2013.01); *H01L 21/76832* (2013.01); *H01L 21/76834* (2013.01); *H01L 23/5226* (2013.01); *H01L 23/53295* (2013.01)

(58) Field of Classification Search
CPC ......... H01L 21/76897; H01L 21/76832; H01L 21/76834; H01L 23/5226; H01L 23/53295
See application file for complete search history.

(56) References Cited

U.S. PATENT DOCUMENTS

| | | | |
|---|---|---|---|
| 6,265,779 B1 * | 7/2001 | Grill ................. | H01L 21/76843 257/E21.264 |
| 6,764,774 B2 * | 7/2004 | Grill ................... | H01L 23/5329 257/774 |
| 6,878,615 B2 * | 4/2005 | Tsai ................... | H01L 21/76807 438/618 |

(Continued)

OTHER PUBLICATIONS

List of IBM Patents or Patent Applications Treated as Related dated Dec. 15, 2021, 2 pages.

(Continued)

*Primary Examiner* — Eugene Lee
(74) *Attorney, Agent, or Firm* — Tutunjian & Bitetto, P.C.; Robert Richard Aragona

(57) ABSTRACT

A method of forming fully aligned top vias is provided. The method includes forming a fill layer on a conductive line, wherein the fill layer is adjacent to one or more vias. The method further includes forming a spacer layer selectively on the exposed surface of the fill layer, wherein the top surface of the one or more vias is exposed after forming the spacer layer. The method further includes depositing an etch-stop layer on the exposed surfaces of the spacer layer and the one or more vias, and forming a cover layer on the etch-stop layer.

20 Claims, 5 Drawing Sheets

(56) References Cited

U.S. PATENT DOCUMENTS

| | | | |
|---|---|---|---|
| 7,042,095 B2* | 5/2006 | Noguchi | H01L 21/76811 257/773 |
| 7,094,669 B2 | 8/2006 | Bu et al. | |
| 7,135,398 B2* | 11/2006 | Fitzsimmons | H01L 21/76801 438/782 |
| 7,317,253 B2* | 1/2008 | Nogami | H01L 23/53238 257/E21.175 |
| 8,299,625 B2 | 10/2012 | Ponoth et al. | |
| 9,613,861 B2 | 4/2017 | Anderson et al. | |
| 9,953,865 B1* | 4/2018 | Briggs | H01L 23/528 |
| 9,960,110 B2* | 5/2018 | Boyanov | H01L 23/522 |
| 10,020,223 B1 | 7/2018 | Anderson et al. | |
| 10,269,634 B2* | 4/2019 | Wu | H01L 21/76885 |
| 2004/0063305 A1* | 4/2004 | Kloster | H01L 21/7682 438/619 |
| 2007/0267751 A1* | 11/2007 | Yang | H01L 21/288 257/758 |
| 2009/0072406 A1* | 3/2009 | Yang | H01L 21/76843 257/E21.24 |
| 2013/0082393 A1* | 4/2013 | Kawamura | H01L 23/53295 257/773 |
| 2015/0056800 A1 | 2/2015 | Mebarki et al. | |
| 2017/0084485 A1* | 3/2017 | Lin | H01L 21/7681 |
| 2018/0315707 A1* | 11/2018 | Fox, III | H01L 23/562 |
| 2018/0323102 A1 | 11/2018 | Redzheb et al. | |
| 2019/0100837 A1 | 4/2019 | Haukka et al. | |
| 2019/0363048 A1* | 11/2019 | Zhao | H01L 23/5226 |
| 2020/0411433 A1* | 12/2020 | Lilak | H01L 21/823475 |

OTHER PUBLICATIONS

Briggs et al., "Fully Aligned Via Integration for Extendibility of Interconnects to Beyond the 7 nm Node", IEEE Dec. 2017, pp. 338-341.

Hashemi et al., "Selective Deposition of Dielectrics: Limits and Advantages of Alkanethiol Blocking Agents on Metal-Dielectric Patterns", ACS Appl. Mater. Interfaces, Nov. 2016, pp. 33264-33272.

* cited by examiner

FULLY ALIGNED TOP VIAS

BACKGROUND

The present invention generally relates to formation of vias with metallization layers, and more particularly to fully aligned top vias with metallization layers.

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a metal-oxide-semiconductor field effect transistor (MOSFET) with a single gate parallel with the plane of the substrate. Depending on the doping of the source and drain, an NFET or a PFET can be formed. Two FETs also can be coupled to form a complementary metal oxide semiconductor (CMOS) device, where a p-type MOSFET and n-type MOSFET are coupled together.

SUMMARY

In accordance with an embodiment of the present invention, a method of forming fully aligned top vias is provided. The method includes forming a fill layer on a conductive line, wherein the fill layer is adjacent to one or more vias. The method further includes forming a spacer layer selectively on the exposed surface of the fill layer, wherein the top surface of the one or more vias is exposed after forming the spacer layer. The method further includes depositing an etch-stop layer on the exposed surfaces of the spacer layer and the one or more vias, and forming a cover layer on the etch-stop layer.

In accordance with another embodiment of the present invention, a method of forming fully aligned top vias is provided. The method includes forming a fill layer on a conductive line, wherein the fill layer is adjacent to one or more vias. The method further includes forming a spacer layer selectively on the exposed surface of the fill layer by a selective atomic layer deposition (ALD) or plasma enhanced ALD (PEALD) using precursors selective for the material of the fill layer but not the material of the vias, wherein the top surface of the one or more vias is exposed after forming the spacer layer. The method further includes depositing an etch-stop layer on the exposed surfaces of the spacer layer and the one or more vias. The method further includes forming a cover layer on the etch-stop layer, and forming at least two openings in the cover layer, wherein one of the openings is at least partially aligned with one of the one or more vias, and one of the openings is not aligned with the one or more vias.

In accordance with yet another embodiment of the present invention, a fully aligned top via is provided. The fully aligned top via includes a fill layer on a conductive line, wherein the fill layer is adjacent to one or more vias. The fully aligned top via further includes a spacer layer on the fill layer, and an etch-stop layer on at least a portion of the spacer layer and at least a portion of one of the one or more vias. The fully aligned top via further includes one or more cover layer regions on the etch-stop layer, and a plurality of openings, wherein each of the openings is adjacent to at least one of the one or more cover layer regions, and one of the plurality of openings is at least partially aligned with one of the one or more vias, and another of the plurality of openings is not aligned with the one or more vias.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide metallization layers with increased electrical insulator thickness between conductive fills and conductive vias that alleviates reductions in maximum voltages, Vmax, and can increase the chip-level yield for production chips. The minimum spacing between the top of the via and bottom of an adjacent trench containing a conductive fill is maximized relative to metallization layers without an extra electrically insulating spacer. This results in a lower line resistance and decreased via resistance variability as well an important increase in Vmax. This can result in a lower line resistance and decreased via resistance variability as well as the increase in Vmax.

Embodiments of the present invention provide a method of fabricating metallization layers with increased electrical insulator thickness between conductive fills and conductive vias, where the vias can initially be formed subtractively from a metallization layer. The overlying opening and conductive fill can be self-aligned with the via using the etch selectivity of a spacer layer and etch-stop layer. An etch stop layer can be deposited conformally after the selective dielectric deposition on an ultra-low-k (ULK) material spacer, and before the dielectric deposition for an overlying metallization layer. A dielectric spacer layer can be deposited selectively on an exposed ULK surface, providing a conducive topography to fully-align the metal features above.

Exemplary applications/uses to which the present invention can be applied include, but are not limited to: semiconductor chips, including, memory chips (i.e., analog memory and digital memory), logic chips (e.g., NAND gates, NOR gates, etc.), clock chips, processors (e.g., central processing units (CPUs), digital signal processing units (DSPs), etc.), and application specific integrated circuits (ASICs).

It is to be understood that aspects of the present invention will be described in terms of a given illustrative architecture; however, other architectures, structures, substrate materials and process features and steps can be varied within the scope of aspects of the present invention.

Figure 1:
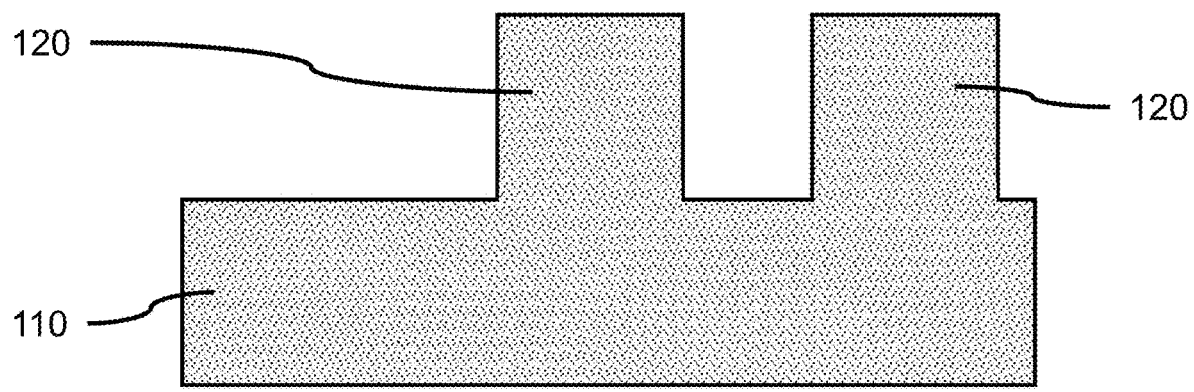
FIG. 1 is a cross-sectional side view showing a plurality of vias on a conductive line, in accordance with an embodiment of the present invention.

Referring now to the drawings in which like numerals represent the same or similar elements and initially to FIG. 1, a cross-sectional side view of a plurality of vias on a conductive line is shown, in accordance with an embodiment of the present invention.

In one or more embodiments, a plurality of vias 120 can be formed on a conductive line 110 by a subtractive method. Portions of a thick conductive line can be removed to form the up-vias integral with the remaining portion of the conductive line 110. The portions of the initial thick metal line can be removed by masking and selective etching. In various embodiments, the conductive line 110 and vias 120 can be on a substrate, where the substrate includes semiconductor devices and passive circuits components connected to the conductive line 110 and vias 120. The conductive line 110 can be part of a lower metallization layer (e.g., M1) on a substrate with electronic devices.

In various embodiments, the vias 120 and conductive line 110 can be a conductive material, including, but not limited to, metals, for example, copper (Cu), tungsten (W), cobalt (Co), molybdenum (Mo), nickel (Ni), silver (Ag), gold (Au), platinum (Pt), conductive carbon, for example, carbon nanotubes (CNTs), graphene, and combinations thereof.

In various embodiments, the vias 120 can have a height from the top surface of the conductive line 110 in a range of about 5 nanometers (nm) to about 35 nm, or about 10 nm to about 25 nm, although other heights are also contemplated. The vias 120 can have a height from the top surface of the conductive line 110 of about 0.5 times the via pitch to about 1.5 times the via pitch, for example, a semiconductor device with a sub-24 nm pitch technology can have a corresponding via height in a range of about 12 nm to about 32 nm.

In various embodiments, the vias 120 can have a width in a range of about 5 nanometers (nm) to about 15 nm, or about 7 nm to about 10 nm, although other widths are also contemplated. The vias 120 can have a width of about 0.5 times the via pitch, for example, a semiconductor device with a sub-24 nm pitch technology can have a corresponding via width of about 12 nm or less.

Figure 2:
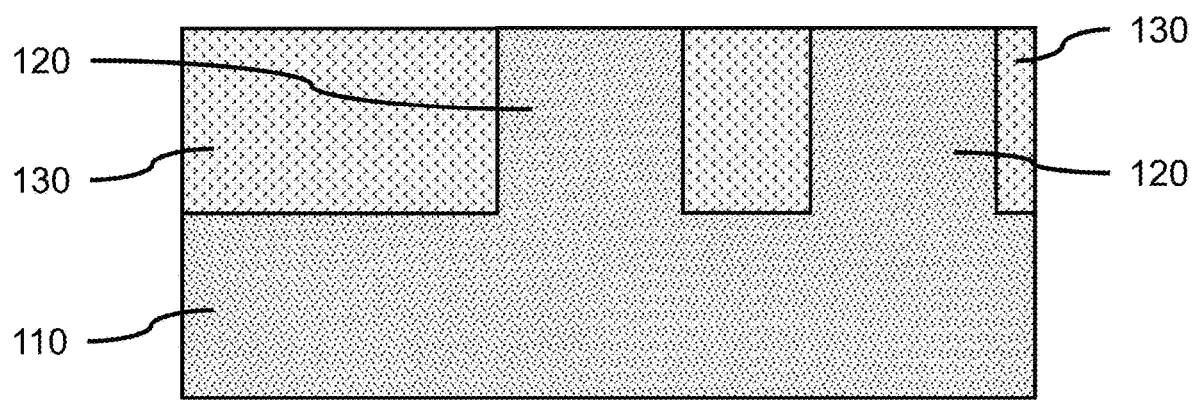
FIG. 2 is a cross-sectional side view of a fill layer on the conductive line and adjacent to the plurality of vias, in accordance with an embodiment of the present invention.

FIG. 2 is a cross-sectional side view of a fill layer on the conductive line and adjacent to the plurality of vias, in accordance with an embodiment of the present invention.

In one or more embodiments, a fill layer 130 can be formed on the conductive line 110 and adjacent to the vias 120, where the fill layer 130 can be formed by a blanket deposition, for example, chemical vapor deposition (CVD), plasma enhanced CVD (PECVD), spin-on process, or a combination thereof. The fill layer 130 can cover the conductive line 110 and vias 120, and the portion of the fill layer 130 extending above the top surfaces of the vias 120 can be removed, for example, using a chemical-mechanical polishing (CMP). The fill layer 130 can be planarized so the top surfaces of the fill layer 130 and the top surfaces of the vias 120 can be approximately coplanar (e.g., within tolerances of CMP process).

In various embodiments, the fill layer 130 can be an electrically insulating dielectric material, including, but not limited to, silicon oxide (SiO), silicon nitride (SiN), silicon oxynitride (SiON), silicon oxycarbide (SiOC), silicon boronitride (SiBN), silicon carbonitride (SiCN), silicon boro carbonitride (SiBCN), low-k dielectric materials, and combinations thereof. Low-k dielectric can include, but not be limited to, carbon doped silicon oxide or organosilicate glasses (SiO:C), fluorine doped silicon oxide (SiO:F), silicon based polymeric dielectric materials, for example, hydrogen silsesquioxane (HSQ) and methylsilsesquioxane (MSQ), tetraethyl orthosilicate (TEOS), and combinations thereof.

Figure 3:
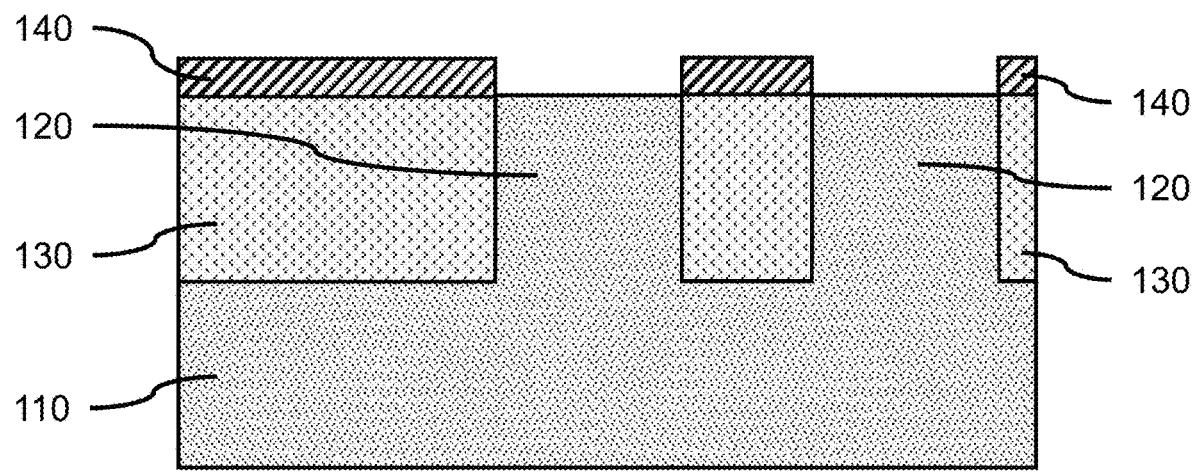
FIG. 3 is a cross-sectional side view of a spacer layer on the surfaces of the fill layer without covering the plurality of vias, in accordance with an embodiment of the present invention.

FIG. 3 is a cross-sectional side view of a spacer layer on the surfaces of the fill layer without covering the plurality of vias, in accordance with an embodiment of the present invention.

In one or more embodiments, a spacer layer 140 can be formed on the surface(s) of the fill layer 130 without covering the plurality of vias 120 by utilizing a selective deposition process, for example, a selective atomic layer deposition (ALD) or plasma enhanced ALD (PEALD) using precursors selective for the material of the fill layer 130 but not the material of the vias 120. The spacer layer 140 can be formed to a predetermined thickness on the surface(s) of the fill layer 130 using the selective ALD, PEALD, or combination thereof.

In various embodiments, the spacer layer 140 can have a thickness in a range of about 1 nm to about 15 nm, or about 5 nm to about 10 nm, although other thicknesses are also contemplated. The thickness of the spacer layer 140 can be sufficiently thick to provide sufficient separation between the lines formed by a conductive fill and the vias. A spacer layer that is too thick can impose a capacitance penalty due to the proximity of the spacer to the metal lines of the metallization layers. A spacer layer that is too thin can fail to increase the line to via spacing and thereby fail to increase the maximum voltage. The spacer thickness can be determined by the capability of the layer formation process. A deposition thickness of just 1 nm is achievable. A thicker spacer layer is also achievable, but if the spacer layer is too thick then it restricts the available area for metal to exist.

In various embodiments, the spacer layer 140 can be an electrically insulating dielectric material, including, but not limited to, silicon oxide (SiO), silicon nitride (SiN), silicon oxynitride (SiON), silicon oxycarbide (SiOC), silicon boronitride (SiBN), silicon carbonitride (SiCN), silicon boro carbonitride (SiBCN), low-k dielectric materials, and combinations thereof. The spacer layer 140 can be a different electrically insulating dielectric material from the fill layer 130, so the spacer layer 140 can be selectively removed relative to the fill layer 130. In various embodiments, the spacer layer 140 can be a low-k material, for example, carbon doped silicon oxide or organosilicate glasses (SiO:C), to minimize capacitance with the underlying the conductive line.

Figure 4:
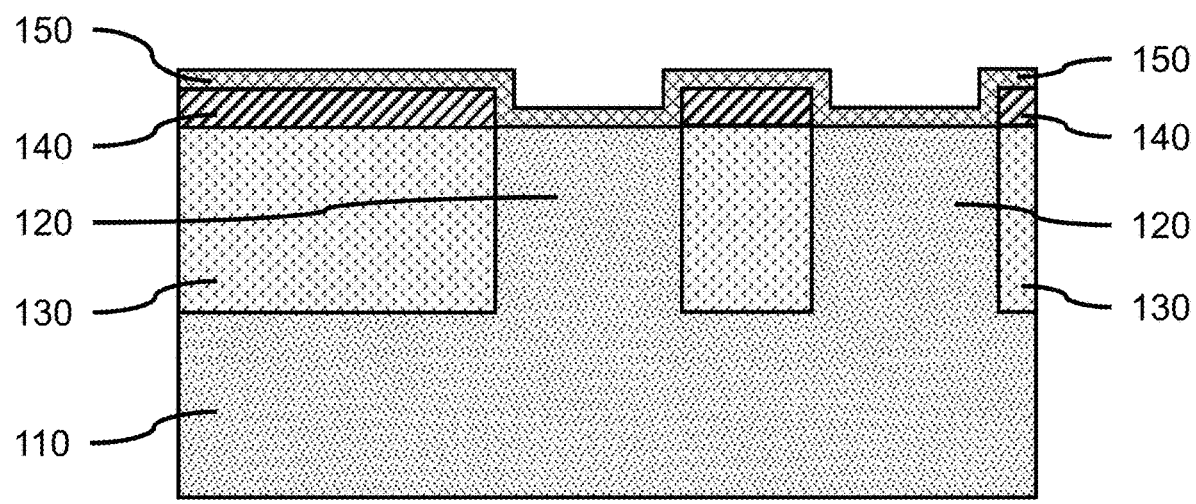
FIG. 4 is a cross-sectional side view of an etch-stop layer on the surfaces of the spacer layer and the plurality of vias, in accordance with an embodiment of the present invention.

FIG. 4 is a cross-sectional side view of an etch-stop layer on the surfaces of the spacer layer and the plurality of vias, in accordance with an embodiment of the present invention.

In one or more embodiments, an etch-stop layer 150 can be formed on the exposed surfaces of the spacer layer 140 and the plurality of vias 120, where the etch-stop layer 150 can be formed by a conformal deposition, for example, ALD, PEALD, or a combination thereof. The etch-stop layer 150 can cover the exposed top surfaces of the spacer layer 140 and the vias 120, as well as the edges and sidewalls of the spacer layer 140 adjacent to the vias 120 to form steps between the top surface of the spacer layer 140 and the top surfaces of the vias 120. The top surface of the spacer layer 140 and the top surfaces of the vias 120 can be at different elevations determined by the thickness of the spacer layer 140. The etch-stop layer 150 can be at different elevations, where a portion of a continuous etch-stop layer 150 is on the spacer layer 140 and a portion of a continuous etch-stop layer 150 is on a via 120.

In various embodiments, the etch-stop layer 150 can be an electrically insulating dielectric material, including, but not limited to, silicon oxide (SiO), silicon nitride (SiN), silicon oxynitride (SiON), silicon oxycarbide (SiOC), silicon boronitride (SiBN), silicon carbonitride (SiCN), silicon boro carbonitride (SiBCN); a metal compound, including a metal carbide or metal nitride, for example, aluminum nitride (AlN), titanium nitride (TiN), tantalum nitride (TaN), hafnium nitride (HfN), titanium-aluminum nitride (TiAlN), titanium carbide (TiC), tamtalum carbide (TaC), titanium-aluminum carbide (TiAlC), aluminum oxide (AlO), and combinations thereof. Combinations can include multilayers or where different regions are different materials. The material of the etch-stop layer 150 can be different from the material of the spacer layer 140, vias 120, and fill layer 130 to provide sufficient etch selectivity to avoid reducing the thickness of the spacer layer 140 from etching.

In various embodiments, the etch-stop layer 150 can have a thickness in a range of about 1 nm to about 10 nm, or about 2 nm to about 5 nm, although other thicknesses are also contemplated. The thickness of the etch-stop layer 150 can be sufficiently thin to minimize the effect on the capacitance of the etch-stop material remaining on the spacer layer 140, while still protecting the spacer layer during subsequent etching processes.

Figure 5:
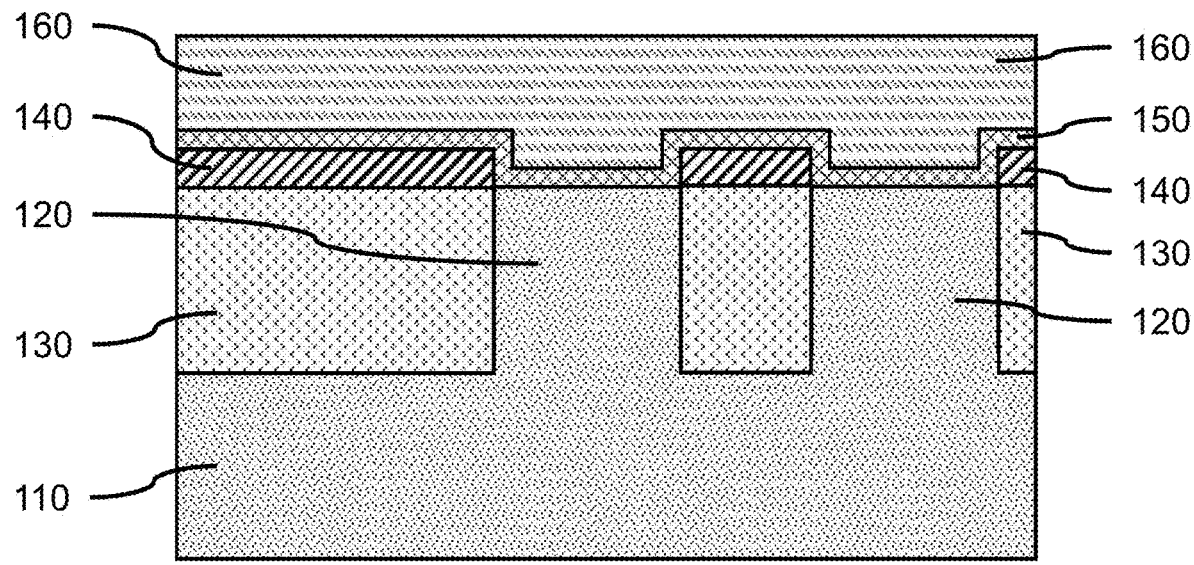
FIG. 5 is a cross-sectional side view of a cover layer on the etch-stop layer over the fill layer and the plurality of vias, in accordance with an embodiment of the present invention.

FIG. 5 is a cross-sectional side view of a cover layer on the etch-stop layer over the fill layer and the plurality of vias, in accordance with an embodiment of the present invention.

In one or more embodiments, a cover layer 160 can be formed on the etch-stop layer 150 and over the spacer layer 140 and the vias 120, where the cover layer 160 can be formed by a blanket deposition (e.g., CVD, PECVD, spin-on, combination thereof).

In various embodiments, the cover layer 160 can be an ultra low-k dielectric material (i.e., having a dielectric constant of 2.5 or less), including, but not limited to, porous organosilicate glass (pSiCOH). In various embodiments, the cover layer 160 can be a thin (1 nm to 2 nm) layer of aluminum oxide (AlO).

In various embodiments, the cover layer 160 can have a thickness in a range of about 1 nm to about 10 nm, or about 2 nm to about 5 nm, although other thicknesses are also contemplated. The thickness of the cover layer 160 can be sufficiently thin to minimize the effect on the capacitance. A CMP can be used to provide the cover layer 160 with a smooth, flat surface.

Figure 6:
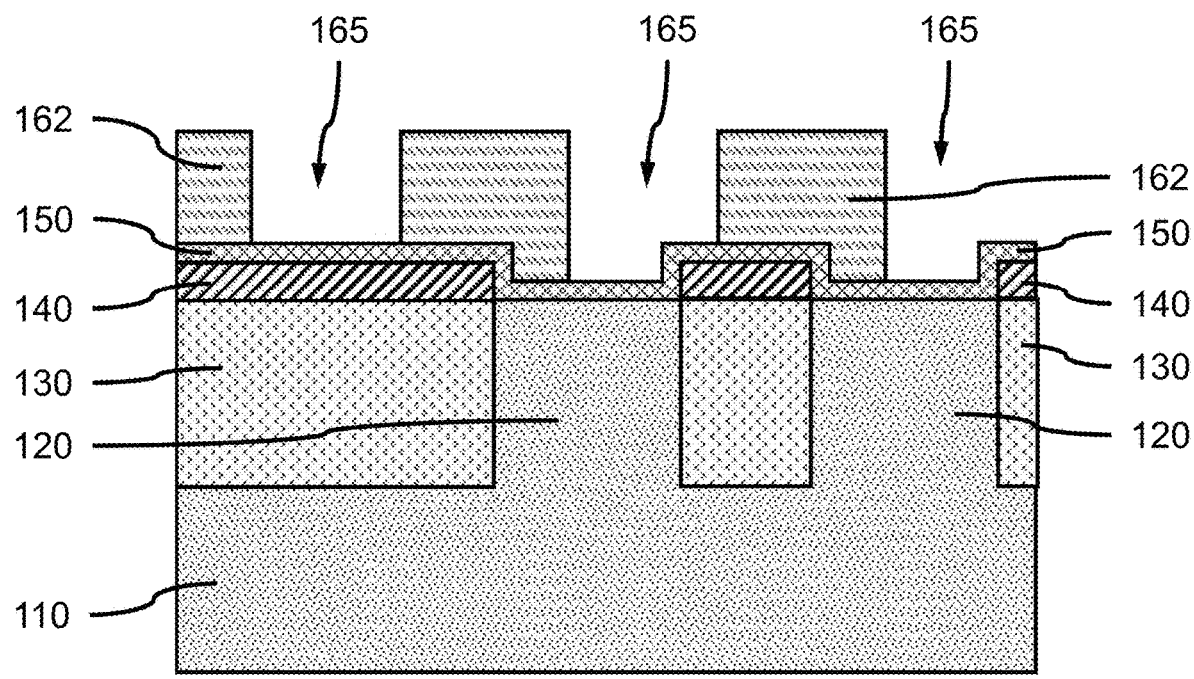
FIG. 6 is a cross-sectional side view of a plurality of openings formed in the cover layer, in accordance with an embodiment of the present invention.

FIG. 6 is a cross-sectional side view of a plurality of openings formed in the cover layer, in accordance with an embodiment of the present invention.

In one or more embodiments, a plurality of openings 165 can be formed in the cover layer 160, where the openings 165 can be formed by masking the cover layer using lithographic processes, and removing portions of the cover layer 160 exposed through a mask using a selective directional etch, for example, reactive ion etching (RIE) to form one or more cover layer regions 162, depending on whether the openings 165 dissect the cover layer or remove separate individual sections. The openings 165 can be, for example, trenches for forming upper conductive lines of an intermediate or upper metallization layer (e.g., M2).

In various embodiments, the plurality of openings 165 can be approximately aligned with the plurality of vias 120, although one or more openings can be over sections of the conductive line 110 not including a via 120. The openings 165 can be approximately aligned with the vias as determined by masking errors, alignment errors, and the like, where a portion of the opening 165 may be formed over a region of the spacer layer 140 and fill layer 130, and a region 162 of the cover layer may remain over the via 120. A step in the etch-stop layer 150 on the spacer layer 140 may be exposed by an opening 165. A section of the etch-stop layer 150 may be between the a cover layer region 162 and the underlying via 120. Other sections of the etch-stop layer 150 can be exposed by the opening(s) 165.

Figure 7:
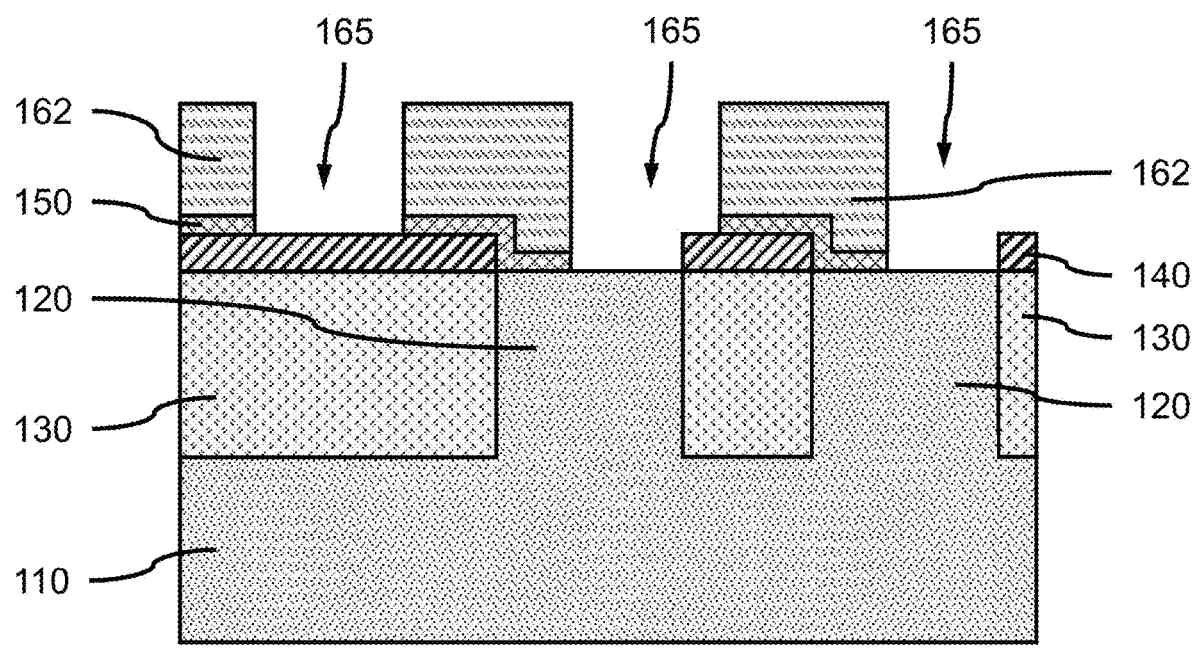
FIG. 7 is a cross-sectional side view of portions of the etch-stop layer exposed through the openings in the cover layer removed to expose portions of the underlying vias, in accordance with an embodiment of the present invention.

FIG. 7 is a cross-sectional side view of portions of the etch-stop layer exposed through the openings in the cover layer removed to expose portions of the underlying vias, in accordance with an embodiment of the present invention.

In one or more embodiments, portions of the etch-stop layer 150 exposed through the openings 165 in the cover layer can be removed to expose portions of the underlying vias 120, where the portions of the etch-stop layer 150 can be removed by a selective directional etch (e.g., RIE). Removal of the exposed portions of the etch-stop layer 150 can expose portions of the underlying vias 120 and/or spacer layer 140, where the etch selectivity of the etch can avoid thinning the spacer layer 140.

Figure 8:
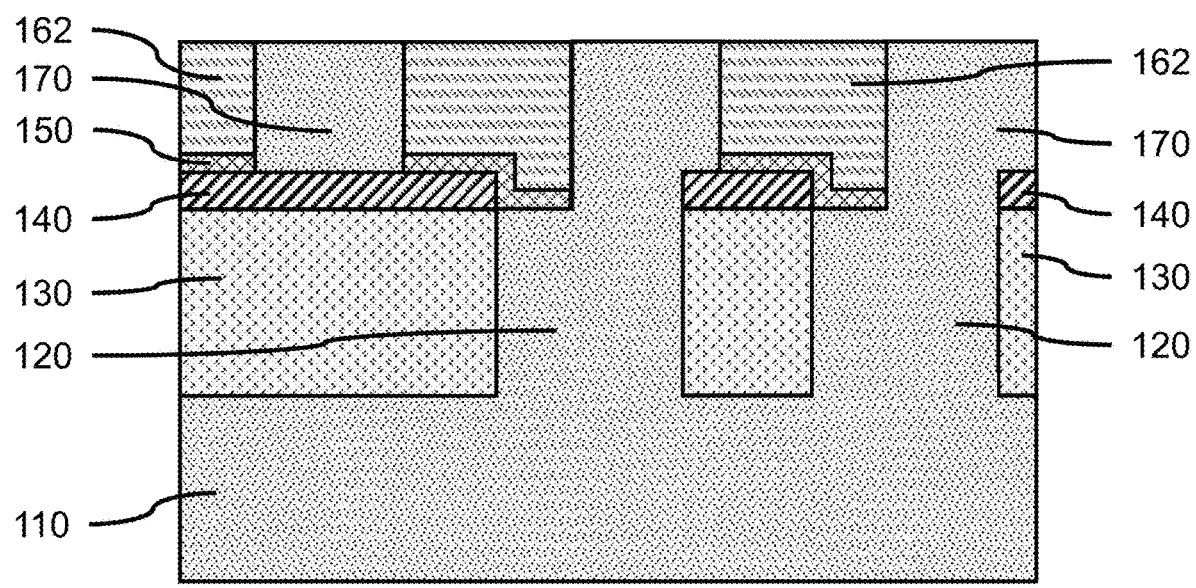
FIG. 8 is a cross-sectional side view of conductive fill formed in the plurality of openings in the cover layer, in accordance with an embodiment of the present invention.

FIG. 8 is a cross-sectional side view of conductive fill formed in the plurality of openings in the cover layer, in accordance with an embodiment of the present invention.

In one or more embodiments, a conductive fill 170 can be formed in the openings 165, where the conductive fill 170 can be formed by a conformal deposition (e.g., ALD, PEALD), a blanket deposition (e.g., CVD, PECVD, metal-organic CVD (MOCVD)), and combinations thereof. In various embodiments, a CMP can be used to remove excess material on upper surfaces outside of the openings 165.

In various embodiments, the conductive fill 170 can be a conductive material, including, but not limited to, metals, for example, copper (Cu), tungsten (W), cobalt (Co), molybdenum (Mo), nickel (Ni), silver (Ag), gold (Au), platinum (Pt), conductive carbon, for example, carbon nanotubes (CNTs), graphene, and combinations thereof.

Figure 9:
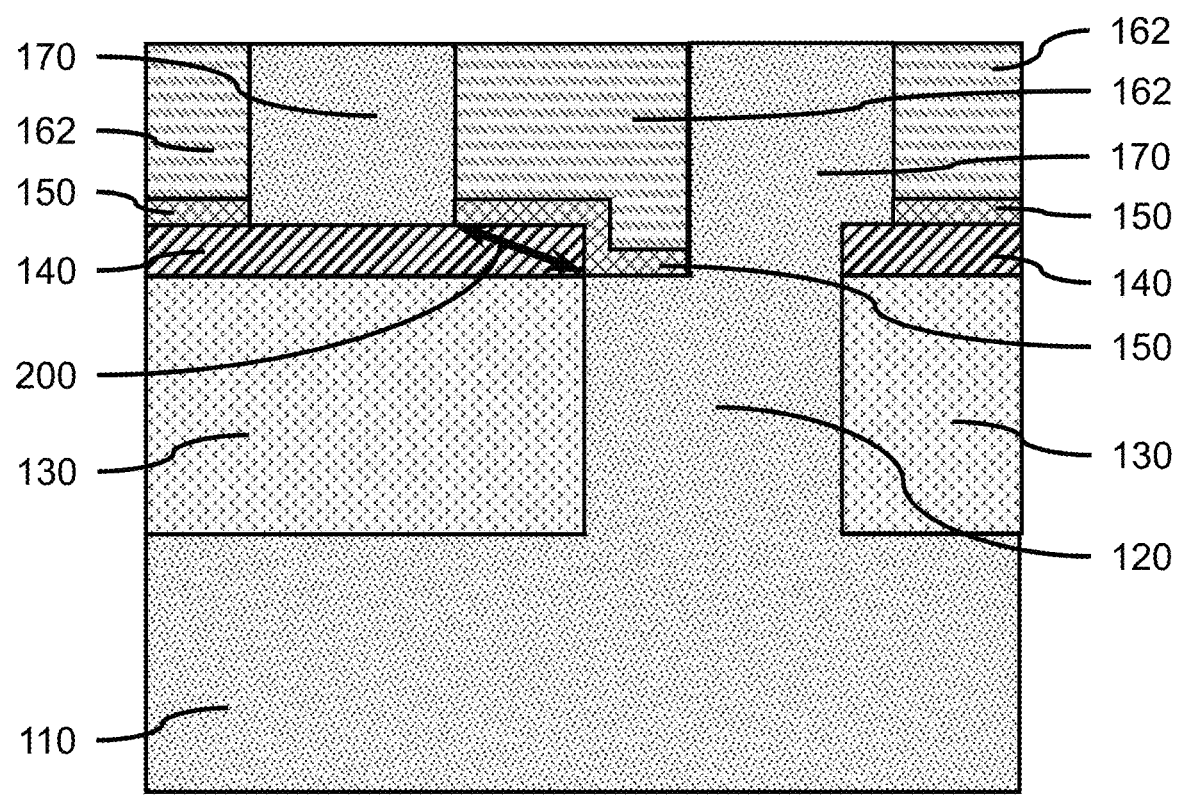
FIG. 9 is an enlarged view of FIG. 8 showing the increased insulator thickness between misaligned conductive fills and vias, in accordance with an embodiment of the present invention.

FIG. 9 is an enlarged view of FIG. 8 showing the increased insulator thickness between misaligned conductive fills and vias, in accordance with an embodiment of the present invention.

In one or more embodiments, the distance 200 between one conductive fill 170 and the closest point of an adjacent via 120 can be increased by the diagonal distance of the spacer layer 140, as compared to an arrangement of the vias 120, fill layer 130, cover layer regions 162, and conductive fill(s) 170 without a spacer layer 140. The distance 200 between one conductive fill 170 and the closest point of an adjacent via 120 can be the hypotenuse of the triangle formed by the corner of the conductive fill 170 and the corner of the via 120 with the closest approach, where the thickness of the spacer layer 140 determines the length of one of the right angles of the triangle.

In various embodiments, the distance 200 can be in a range of about 5 nm to about 20 nm, or about 8 nm to about 15 nm, although other distances are also contemplated. The increased distance 200 formed by the insulating dielectric material of the spacer layer 140 can increase the maximum voltages, Vmax, by up to about 100 millivolts (mV) at sub-30 nm pitch dimensions.

In various embodiments, the relationship between the maximum voltages, Vmax, and thickness of the spacer layer can depend on the particular design of the device structure, dimensions of the lines (conductive fill) and vias, and overlay tolerances, where the maximum voltages, Vmax, can vary by several hundred millivolts based on such parameters.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative teams are intended to encompass different orientations of the device in use or operation in addition to the orientation depicted in the FIGS. For example, if the device in the FIGS. is turned over, elements described as "below" "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An aligned top via, comprising:
   a fill layer on a conductive line, wherein the fill layer is adjacent to one or more vias;
   a spacer layer aligned to an upper surface of the fill layer;
   an etch-stop layer on at least a portion of the spacer layer and at least a portion of one of the one or more vias;
   one or more cover layer regions on the etch-stop layer; and
   a plurality of openings, wherein each of the openings is adjacent to at least one of the one or more cover layer regions, and one of the plurality of openings is at least partially aligned with one of the one or more vias, and another of the plurality of openings is not aligned with the one or more vias.

2. The aligned top via of claim 1, further comprising a conductive fill in each of the plurality of openings, wherein the conductive fill is in electrical contact with one of the one or more vias aligned with one of the plurality of openings.

3. The aligned top via of claim 2, wherein the spacer layer has a thickness in a range of about 1 nm to about 15 nm.

4. The aligned top via of claim 3, wherein the spacer layer has a thickness in a range of about 5 nm to about 10 nm.

5. The aligned top via of claim 4, wherein the spacer layer is an electrically insulating dielectric material selected from the group consisting of silicon oxide (SiO), silicon nitride (SiN), silicon oxynitride (SiON), silicon oxycarbide (SiOC), silicon boronitride (SiBN), silicon carbonitride (SiCN), silicon boro carbonitride (SiBCN), low-k dielectric materials, and combinations thereof.

6. The aligned top via of claim 5, wherein the etch-stop layer is a metal compound selected from the group consisting of aluminum nitride (AlN), titanium nitride (TiN), tantalum nitride (TaN), hafnium nitride (HfN), titanium-aluminum nitride (TiAlN), titanium carbide (TiC), tamtalum carbide (TaC), titanium-aluminum carbide (TiAlC), aluminum oxide (AlO), and combinations thereof.

7. The aligned top via of claim 6, wherein an increased distance between one conductive fill and the closest point of an adjacent via of the one or more vias is in a range of about 5 nm to about 20 nm.

8. The aligned top via of claim 7, wherein the spacer layer is a different electrically insulating dielectric material from the fill layer.

9. An aligned top via, comprising:
   a fill layer on a conductive line, wherein the fill layer is adjacent to one or more vias;
   a spacer layer aligned to an upper surface of the fill layer;
   an etch-stop layer on at least a portion of the spacer layer and at least a portion of one of the one or more vias, wherein portions of the etch-stop layer are at different elevations;
   one or more cover layer regions on the etch-stop layer; and
   a plurality of openings, wherein each of the openings is adjacent to at least one of the one or more cover layer regions, and one of the plurality of openings is at least partially aligned with one of the one or more vias, and another of the plurality of openings is not aligned with the one or more vias.

10. The aligned top via of claim 9, wherein the fill layer is an electrically insulating dielectric material selected from the group consisting of silicon oxide (SiO), silicon nitride (SiN), silicon oxynitride (SiON), silicon oxycarbide (SiOC), silicon boronitride (SiBN), silicon carbonitride (SiCN), silicon boro carbonitride (SiBCN), low-k dielectric materials, and combinations thereof.

11. The aligned top via of claim 10, wherein the spacer layer is carbon doped silicon oxide or organosilicate glasses (SiO:C).

12. The aligned top via of claim 11, wherein the etch-stop layer is a metal compound selected from the group consisting of aluminum nitride (AlN), titanium nitride (TiN), tantalum nitride (TaN), hafnium nitride (HfN), titanium-aluminum nitride (TiAlN), titanium carbide (TiC), tamtalum carbide (TaC), titanium-aluminum carbide (TiAlC), aluminum oxide (AlO), and combinations thereof.

13. The aligned top via of claim 12, wherein the spacer layer has a thickness in a range of about 1 nm to about 15 nm.

14. The aligned top via of claim 13, further comprising a conductive fill in each of the plurality of openings, wherein the conductive fill is in electrical contact with one of the one or more vias aligned with one of the plurality of openings.

15. An aligned top via, comprising:
   a fill layer on a conductive line, wherein the fill layer is adjacent to one or more vias;
   a spacer layer aligned to an upper surface of the fill layer, wherein the spacer layer has a thickness in a range of about 1 nm to about 15 nm;
   an etch-stop layer on at least a portion of the spacer layer and at least a portion of one of the one or more vias;
   one or more cover layer regions on the etch-stop layer;
   a plurality of openings, wherein each of the openings is adjacent to at least one of the one or more cover layer regions, and one of the plurality of openings is at least partially aligned with one of the one or more vias, and another of the plurality of openings is not aligned with the one or more vias; and
   a conductive fill in each of the plurality of openings, wherein the conductive fill is in electrical contact with one of the one or more vias aligned with one of the plurality of openings.

16. The aligned top via of claim 15, wherein an increased distance between one conductive fill and the closest point of an adjacent via of the one or more vias is in a range of about 5 nm to about 20 nm compared to one conductive fill and the closest point of an adjacent via without a spacer layer.

17. The aligned top via of claim 16, wherein the spacer layer is a different electrically insulating dielectric material from the fill layer.

18. The aligned top via of claim 17, wherein portions of the etch-stop layer are at different elevations.

19. The aligned top via of claim 18, wherein the cover layer regions are porous organosilicate glass (pSiCOH) or aluminum oxide (AlO).

20. The fully aligned top via of claim 19, wherein the spacer layer is an electrically insulating dielectric material selected from the group consisting of silicon oxide (SiO), silicon nitride (SiN), silicon oxynitride (SiON), silicon oxycarbide (SiOC), silicon boronitride (SiBN), silicon carbonitride (SiCN), silicon boro carbonitride (SiBCN), low-k dielectric materials, and combinations thereof.

\* \* \* \* \*